(12) United States Patent  (10) Patent No.: US 7,658,200 B2
Choi et al.  (45) Date of Patent: Feb. 9, 2010

(54) SEMICONDUCTOR MANUFACTURING APPARATUS AND CONTROL METHOD THEREOF

(75) Inventors: Jae-Sun Choi, Yongin-si (KR); Chi-Ho Han, Suwon-si (KR); Ki-Joong Jang, Suwon-si (KR); Jin-Su Jung, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 595 days.

(21) Appl. No.: 11/198,313

(22) Filed: Aug. 8, 2005

(65) Prior Publication Data

US 2006/0034673 A1  Feb. 16, 2006

(30) Foreign Application Priority Data

Aug. 16, 2004  (KR)  ............... 10-2004-0064446

(51) Int. Cl.
*F16K 39/02*  (2006.01)
(52) U.S. Cl. ............... 137/14; 137/557; 137/487.5; 251/26
(58) Field of Classification Search ........... 137/557, 137/1, 487.5, 14; 251/26, 158, 175
See application file for complete search history.

(56) References Cited

U.S. PATENT DOCUMENTS 3,706,355 A * 12/1972 Oglesbee .................. 184/6
4,607,715 A * 8/1986 Michels et al. ............ 180/118
5,273,188 A * 12/1993 Sanino ...................... 222/61
5,363,872 A * 11/1994 Lorimer .................... 137/1
6,032,419 A * 3/2000 Hurwitt ..................... 137/1
6,042,623 A   3/2000 Edwards
6,058,958 A * 5/2000 Benkowski et al. ....... 137/14
6,186,117 B1 * 2/2001 Matte ....................... 123/437

FOREIGN PATENT DOCUMENTS

| JP | 05-029263 | 2/1993 |
| JP | 05-190463 | 7/1993 |
| JP | 10-233719 | 8/1998 |
| KR | 1998-057913 | 10/1998 |
| KR | 20-0156809 | 6/1999 |
| KR | 20-0177265 | 4/2000 |

* cited by examiner

*Primary Examiner*—Kevin L Lee
(74) *Attorney, Agent, or Firm*—Volentine & Whitt, PLLC (57) ABSTRACT

The present invention provides a semiconductor manufacturing apparatus having a slit valve control system including first and second process chambers disposed adjacent to each other, a slit aperture disposed between the first and second chambers, a slit valve to open and close the slit aperture between first and second chambers, an air source to operate the slit valve, a pressure supply flow path connecting the slit valve with the air source, and a pressure regulator installed on the supply flow path to regulate pressure supplied from the air source to the slit valve.

25 Claims, 6 Drawing Sheets

FIG. 6

SEMICONDUCTOR MANUFACTURING APPARATUS AND CONTROL METHOD THEREOF

BACKGROUND OF THE INVENTION

1. Field of the Invention

The present invention generally relates to a semiconductor manufacturing apparatus and a control method thereof. More particularly, the present invention relates to a semiconductor manufacturing apparatus having a slit valve control system and to a method of controlling the operation of the slit valve so as to open and close a slit aperture formed between chambers.

A claim of priority is made to Korean Patent Application No. 2004-0064446, filed Aug. 16, 2004, the disclosure of which is hereby incorporated by reference in its entirety.

2. Description of the Related Art

Conventionally, a semiconductor manufacturing apparatus includes multiple process chambers disposed adjacent to each other. A manufacturing process is performed under vacuum in the process chambers. The apparatus further includes a treatment chamber to treat wafers, a load lock chamber to load and unload the wafers, and a transfer chamber to transfer the wafers. In general, the transfer chamber is disposed between the process chambers and the load lock chamber.

Each of the chambers described above has a slit aperture formed therein. The slit aperture is used to allow a wafer to pass into and out of the chamber. A slit valve opens and closes the slit aperture. Generally, the slit valve is operated by air pressure. The slit valve includes a valve plate and an actuator to operate the valve plate. An air source to provide pressure to operate the actuator is disposed thereabouts.

The slit valve operates when the pressure difference between the chambers is adjusted. When the pressure difference between the chambers is significant and the slit aperture is opened, problems may arise such as wafers moving within the chambers due to the pressure difference, which causes damage to the wafers, and/or damage to the vacuum pump due to rapid breakage of vacuum within the chambers.

In order to solve these problems, a slit valve is operated by regulating the pressure difference between the chambers. Japanese Laid-open Publication No. 1993-029263, for example, discloses a method of regulating the pressure differences.

The slit valve may also be manually operated to open and close the slit aperture. That is, although in general the slit valve operates automatically, if the semiconductor manufacturing apparatus interlocks during a manufacturing process or during maintenance, an operator may operate the slit valve manually.

When a chamber requires service, the chamber must be under atmospheric pressure prior to servicing the chamber. At this time, if there are wafers in an adjacent chamber and the operator unintentionally operates the slit valve, the wafers may move due to the pressure difference between the chambers, which can cause damage to the wafers and/or damage to the vacuum pump due to rapid breakage of vacuum within the chambers.

SUMMARY OF THE INVENTION

In one aspect of the present invention, a semiconductor manufacturing apparatus having a slit valve control system includes first and second chambers disposed adjacent to each other, a slit aperture operatively interposed between the first and second chambers, a slit valve which is responsive to regulated gas pressure to open and close the slit aperture, a gas pressure source, a pressure supply flow path operatively connected between the slit value and the gas pressure source, and a pressure regulator, installed in the pressure supply flow path, which supplies the regulated gas pressure to the slit value.

In another aspect of the present invention, a semiconductor manufacturing apparatus having a slit valve control system includes first and second chambers disposed adjacent to each other, a first pressure detecting sensor installed on the first chamber, a second pressure detecting sensor installed on the second chamber, a slit aperture disposed between the first and second chambers, a slit valve to open and close the slit aperture, an air source to operate the slit valve, a pressure supply flow path connecting the slit valve with the air source, a pressure regulator installed in the pressure supply flow path to regulate pressure supplied from the air source, and a controller connected to the first and second pressure detecting sensors and connected to the pressure regulator.

In still another aspect of the present invention, a method of controlling a slit valve in a semiconductor manufacturing apparatus includes providing a fixed pressure value, detecting pressures in a first process chamber and a second chamber by first and second sensors, respectively, calculating a pressure difference between the first and second chambers, comparing the calculated pressure difference with the fixed pressure value, and regulating pressure applied to a slit valve disposed between the first and second chambers by supplying a pressure less than a pressure required to operate the slit valve, when the calculated pressure difference is greater than the fixed pressure value.

BRIEF DESCRIPTION OF THE DRAWINGS

These and other aspects of the present invention will become apparent and readily appreciated from the following description of embodiments of the present invention, taken in conjunction with the accompanying drawings of which.

DETAILED DESCRIPTION OF THE INVENTION

Reference will now be made in detail to the embodiments of the present invention, examples of which are illustrated in the accompanying drawings. A slit valve control system is adapted to a semiconductor manufacturing apparatus as described in the following embodiments.

Figure 1:
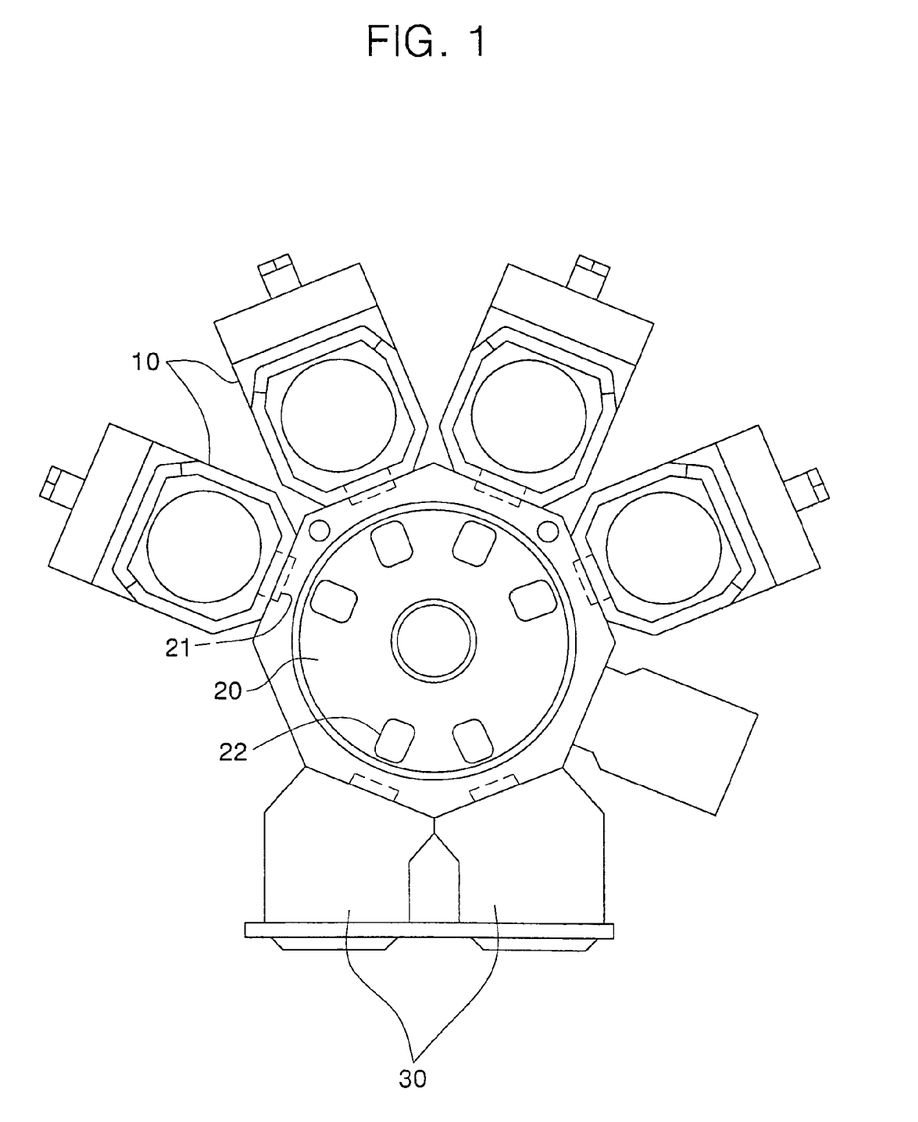
FIG. 1 is a schematic plan view illustrating a configuration of semiconductor manufacturing chambers.

As shown in FIG. 1, a semiconductor manufacturing apparatus includes a plurality of process chambers 10, where manufacturing processes under vacuum are performed, a transfer chamber 20 disposed adjacent to the plurality of process chambers 10 and having a transfer robot (not shown) to transfer wafers to and from the plurality of process chamber 10, and a load lock chamber 30 to load and unload the wafers.

Figure 2:
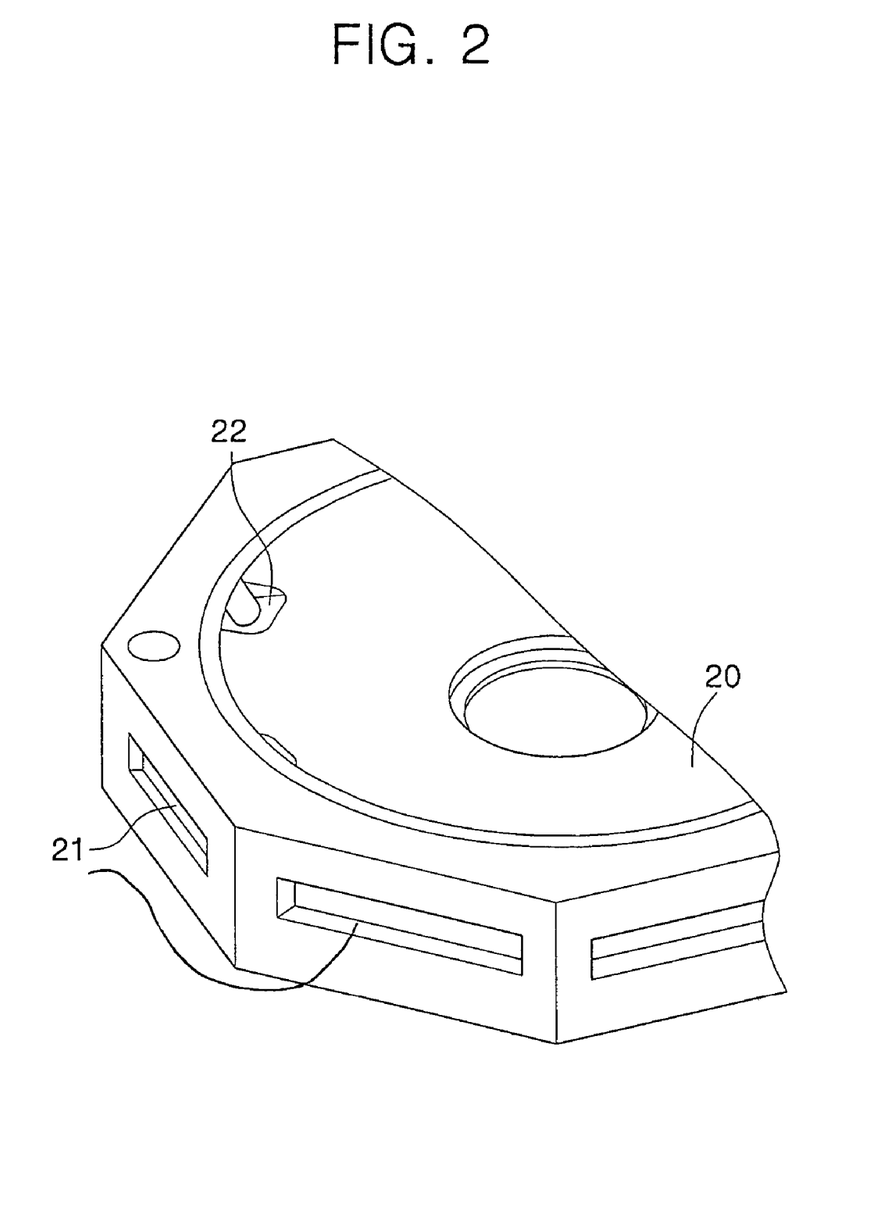
FIG. 2 is a perspective view illustrating a slit aperture and a slit valve.

As shown in FIG. 2, a slit aperture 21, through which a wafer is transferred by an arm of the transfer robot, is disposed at an interface where transfer chamber 20 is in contact with process chamber 10 or load lock chamber 30.

Figure 3:
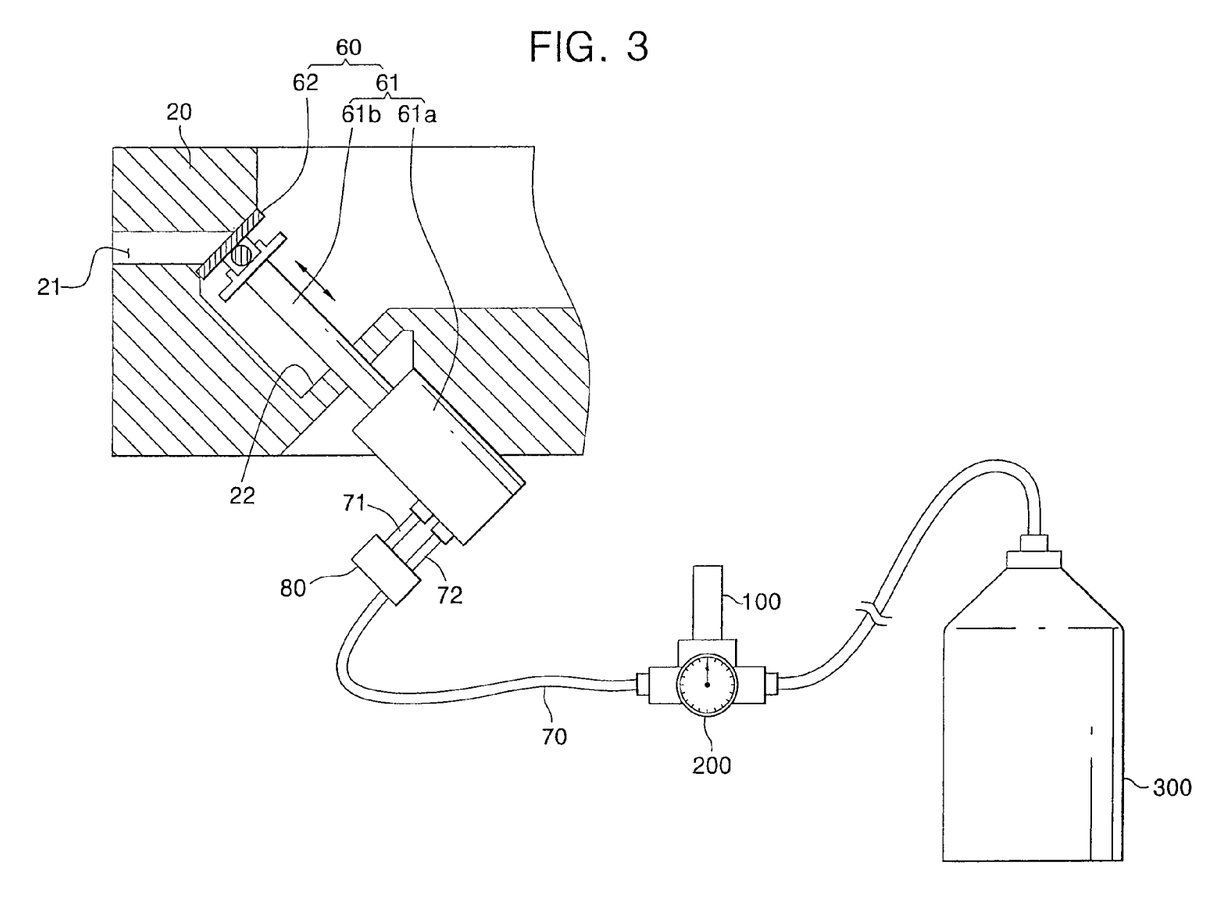
FIG. 3 is a view illustrating a slit valve control system.

As further detailed in FIG. 3, a slit valve 60 to open and close slit aperture 21 is installed in transfer chamber 20. In detail, slit valve 60 is disposed in an installation portion 22 formed in transfer chamber 20. Slit valve 60 includes a valve plate 62, which opens and closes slit aperture 21, and an actuator 61 to mechanically move valve plate 62.

Actuator 61 includes a cylinder 61 a, and a piston rod 61 b which moves in accordance with air pressure supplied to cylinder 61 a.

An air source 300 supplies air to slit valve 60. Air source 300 is preferably a tank containing pressurized air or a high-pressure pump (not shown).

An air supply flow line 70 connects actuator 61 with air source 300. A pressure indicator 200 and a pressure regulator 100 are disposed on air supply flow line 70. Pressure regulator 100 regulates the pressure of air supplied to actuator 61 via air supply flow line 70, and the value of the pressure is indicated by pressure indicator 200.

In addition, a direction control valve 80 is disposed between pressure regulator 100 and slit valve 60. Direction control valve 80 further includes a first direction flow path 71 to move slit valve 60 in a first direction, and a second direction flow path 72 to move silt valve 60 in a second direction. Both first directional flow path 71 and second direction flow path 72 are disposed between direction control valve 80 and actuator 61.

Hereinafter, an embodiment of the present invention will be described with reference to FIGS. 1 to 4.

First Embodiment

Figure 4:
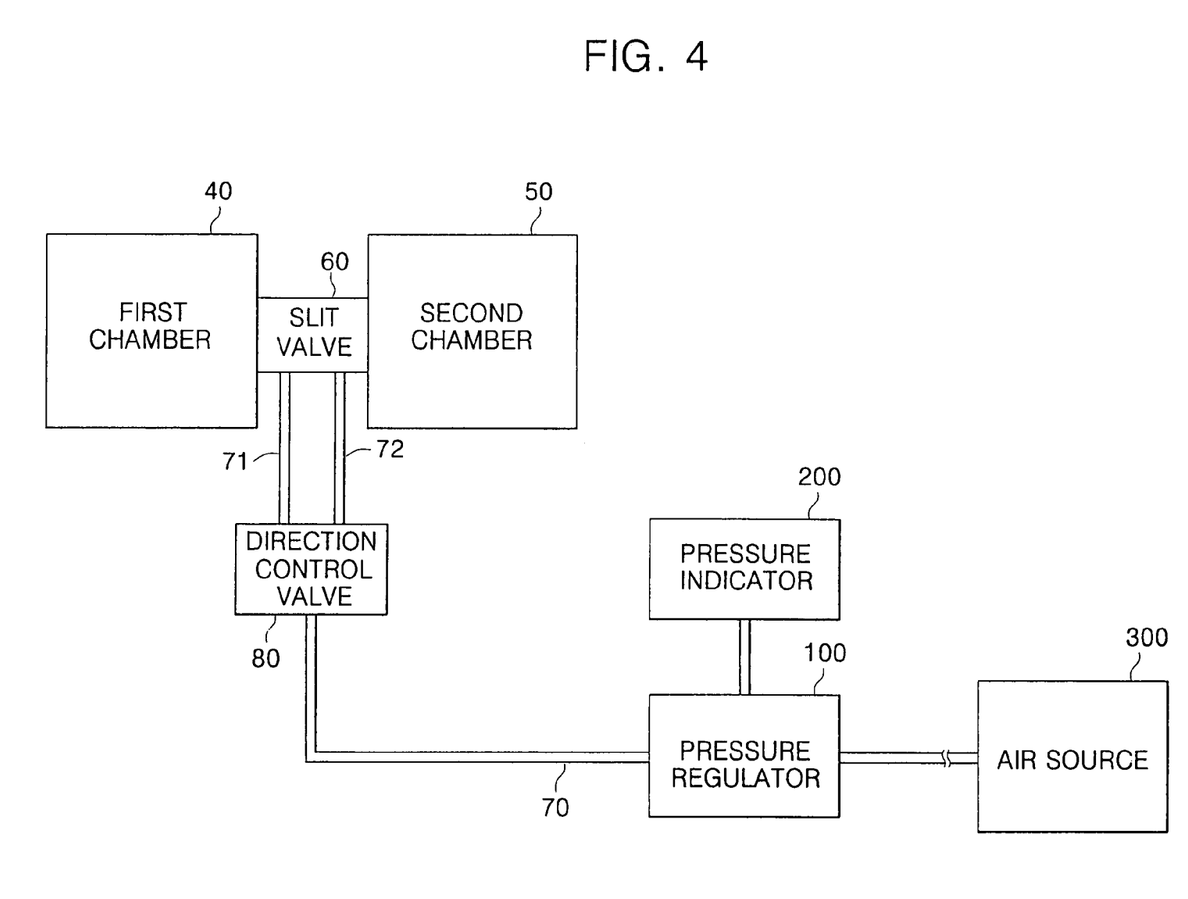
FIG. 4 is a block diagram illustrating a first embodiment of a slit valve control system.

First and second chambers 40 and 50 are provided. A slit aperture 21 is formed between first and second chambers 40 and 50, and a slit valve 60 to open and close slit aperture 21 is installed between first and second chambers 40 and 50. Slit valve 60 includes a valve plate 62 and an actuator 61. Actuator 61 includes a cylinder 61$a$ and a piston rod 61$b$. An air source 300 to supply air to operate slit valve 60 is provided, and an air supply flow line 70 connecting air source 300 with slit valve 60 is also provided.

In addition, a pressure regulator 100 and a pressure indicator 200 are installed on air supply flow line 70. Pressure indicator 200 monitors air pressure supplied by air source 300. Further, a direction control valve 80 is installed between pressure regulator 100 and slit valve 60, and a first direction flow path 71 and a second direction flow path 72 are disposed between direction control valve 80 and slit valve 60. Although not shown, pressure regulator 100 may be installed in the second direction flow path 72.

Regulation of pressure is performed by pressure regulator 100, and an operator may manually operate pressure regulator 100. Pressure regulator 100 may be selectively operated between an automatic operation mode and a manual operation mode.

When first chamber 40 is under vacuum and second chamber 50 is under atmospheric pressure, the pressure difference, for example, between the two chambers 40 and 50 is 1 atm, i.e., 101,325 Pa (N/m$^2$).

If the pressure applied to valve plate 62 is 0.0077 m$^2$, the pressure required to operate valve plate 62 disposed between first chamber and second chamber 50 is 0.0077 m$^2$×101,325 N/m$^2$=780.20N.

If an inner diameter of cylinder 61$a$ is 80 mm, and a diameter of piston rod 61$b$ is 25 mm, a cross-sectional area of cylinder 61 a when piston rod 61$b$ moves back and forth is (0.08 m$^2$×π)/4−(0.025 m$^2$×π)/4=0.0045 m$^2$.

Therefore, the operation pressure to operate slit valve 60 is 780.20 N/0.0045 m$^2$=172,101 Pa, i.e., 1,291 Torr (mmHg).

Accordingly, when pressure regulator 100 sets the operation pressure of slit valve 60 to be less than 172,101 Pa, even if an operator inadvertently presses a switch to open slit valve 60, slit valve 60 does not open.

Second Embodiment

Figure 5:
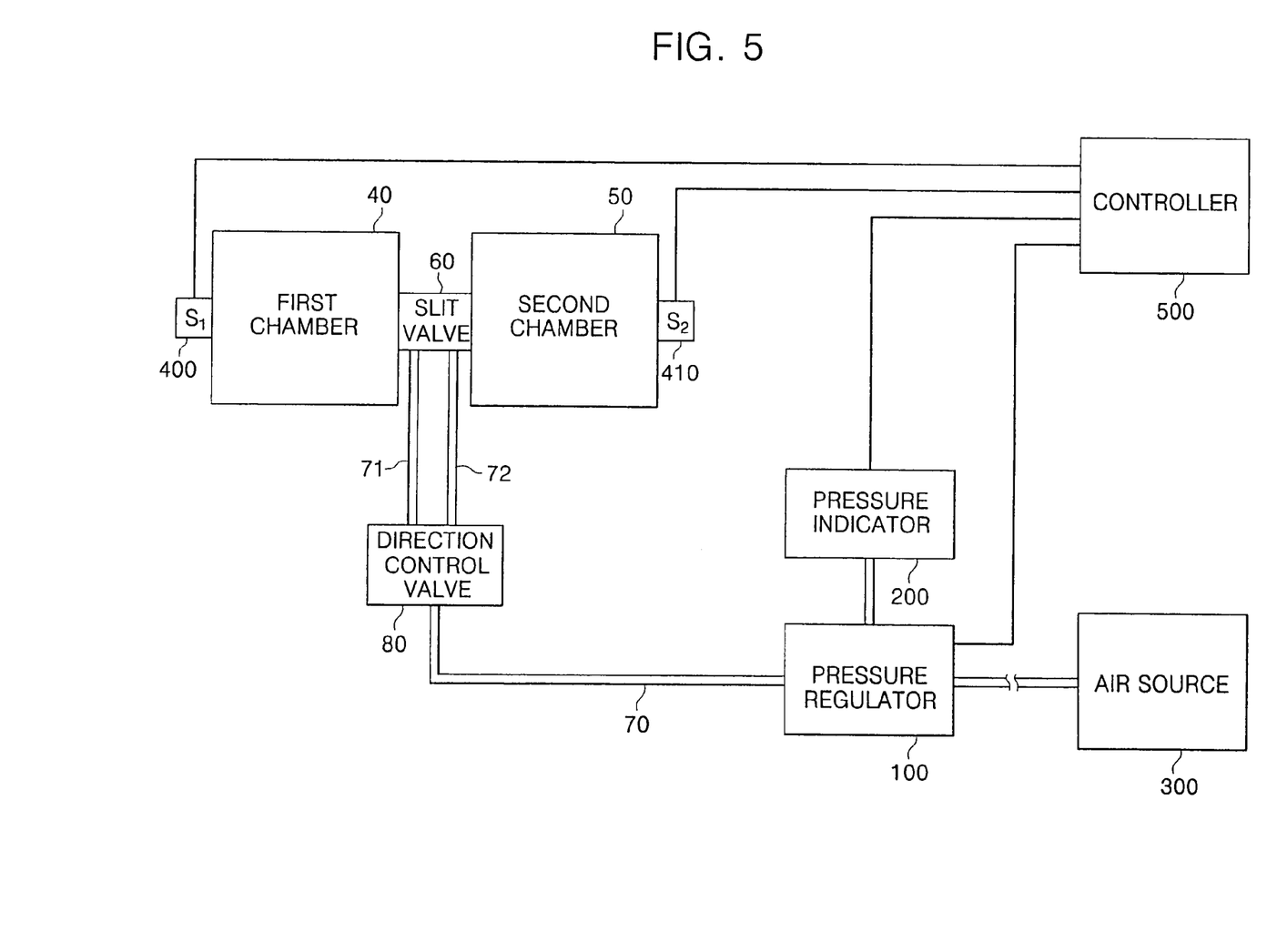
FIG. 5 is a block diagram illustrating a second embodiment of a slit valve control system.

As shown FIG. 5, first and second chambers 40 and 50 are provided. A slit aperture 21 is formed between first and second chambers 40 and 50, and a slit valve 60 to open and close the slit aperture is installed between the first and second chambers 40 and 50. Slit valve 60 includes a valve plate 62 and an actuator 61. Actuator 61 includes a cylinder 61$a$ and a piston rod 61$b$. In addition, slit valve 60 is connected to an air source 300, whereby air source 300 supplies air to operate slit valve 60. An air supply flow line 70 connects air source 300 with slit valve 60.

In addition, a pressure regulator 100 and a pressure indicator 200 are installed on air supply flow line 70. Pressure indicator 200 monitors air pressure supplied by air source 300. Further, a direction control valve 80 is installed between pressure regulator 100 and slit valve 60, and a first direction flow path 71 and a second direction flow path 72 are disposed between direction control valve 80 and slit valve 60. Although not shown, pressure regulator 100 may be installed at second direction flow path 72.

In addition, a first pressure detecting sensor 400 is disposed on first chamber 40, and a second pressure detecting sensor 410 is disposed on second chamber 50. Further, pressure regulator 100, pressure indicator 200, and first and second pressure detecting sensors 400 and 410 are connected to and controlled by a controller 500. In this embodiment, each of first and second pressure detecting sensors 400 and 410 may include a barometric pressure sensor (BPS) (not shown) installed at a pumping portion of first and second chambers 40 and 50.

Figure 6:
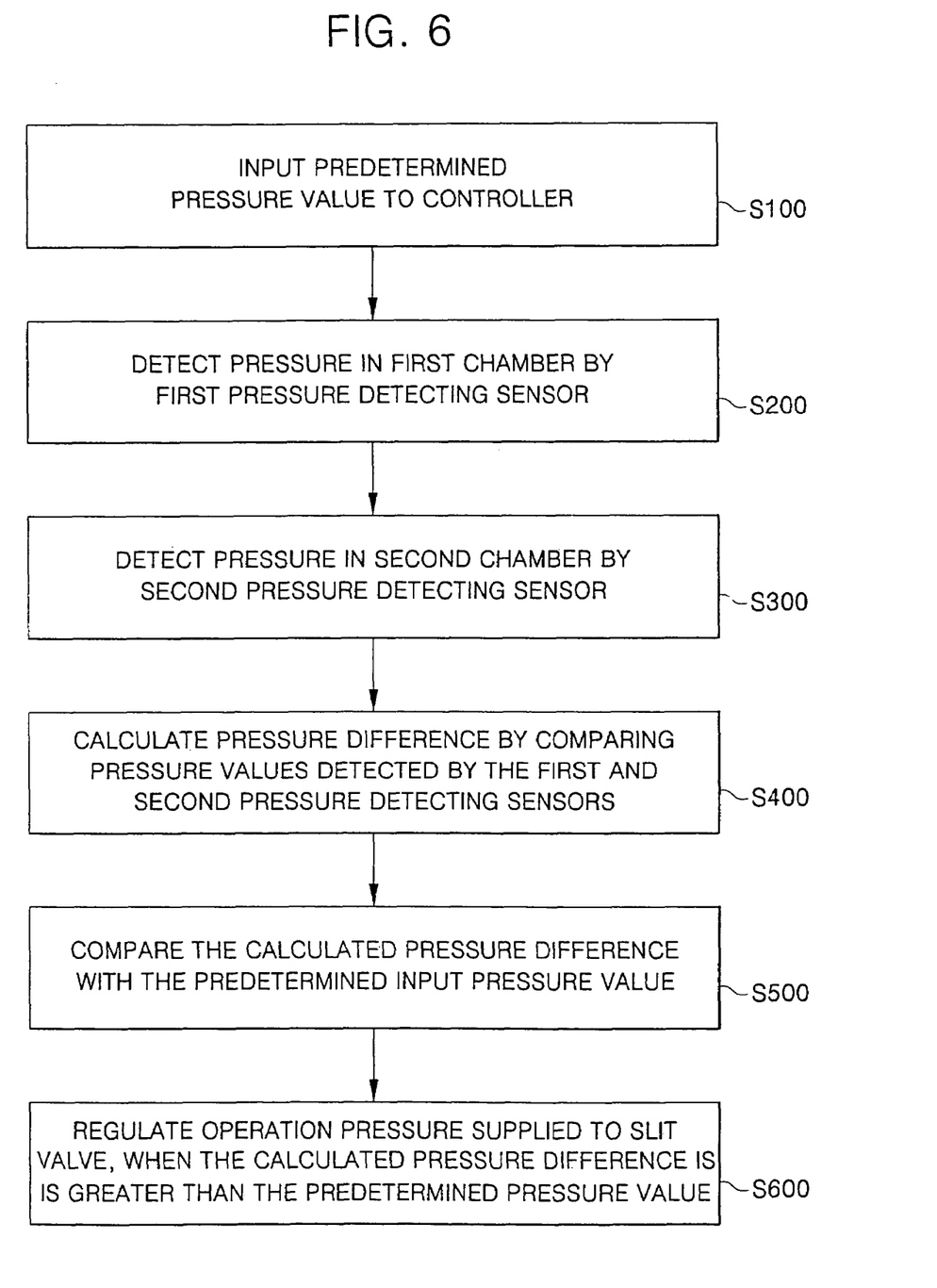
FIG. 6 is a flow chart illustrating a method of controlling a slit valve.

A control method of the slit valve control system of FIG. 5, will now be described in conjunction with FIG. 6.

First, a predetermined pressure value is inputted into controller 500 (S100).

First pressure detecting sensor 400 detects pressure in first chamber 40 (S200). Second detecting sensor 410 detects pressure in second chamber 50 (S300). The detected pressure values are sent to controller 500, and controller 500 compares the detected pressure values to calculate the pressure difference (S400). Then, the pressure difference is compared with the predetermined input pressure value (S500).

If the pressure difference is greater than the predetermined pressure value, controller 500 sends a signal to pressure regulator 100 to regulate the operation pressure applied to slit valve 60 (S600).

The operation pressure is regulated to be greater than, or less than, the pressure value capable of operating slit valve 60 based on the calculation of the pressure difference between the detected pressures.

For example, when first chamber 40 is under vacuum and second chamber 50 is under atmospheric pressure, the pressure difference between the two chambers is 1 atm, i.e., 101,325 Pa. Therefore, the minimum operation pressure for slit valve 60 is 172,101 Pa.

When the predetermined pressure value of controller 500 is 100 Pa, and the pressure difference between the two chambers 40 and 50 is greater than 100 Pa, controller 500 sends a signal to pressure regulator 100 to regulate the pressure to slit valve 60 to be less than 172,101 Pa. Under this condition, even if an operator inadvertently presses the slit valve open switch, slit valve 60 cannot open.

In another example, if first or second chambers 40 and 50 requires service, and therefore the operator must place the chamber under atmospheric pressure, a pressure difference is generated between first and second chambers 40 and 50. Further if the minimal safety pressure difference is less than 100 Pa, the operator can manually input the predetermined pressure value of 100 Pa.

As can be seen from the foregoing, the semiconductor manufacturing apparatus is capable of preventing a slit valve from inadvertently opening, and the semiconductor manufacturing apparatus is capable of automatically setting an operation pressure less than the pressure capable of operating the slit valve corresponding to the pressure difference between two chambers in order to prevent the slit valve from inadvertently opening.

It will be appreciated by those skilled in the art that changes and modification may be made to the present invention without departing from the scope of the invention.

What is claimed is:

1. A semiconductor manufacturing apparatus having a slit valve control system, comprising:
   first and second chambers disposed adjacent to each other;
   a slit aperture operatively interposed between the first and second chambers;
   a slit valve which is responsive to regulated gas pressure to open and close the slit aperture;
   a gas pressure source;
   a pressure supply flow path operatively connected between the slit valve and the gas pressure source; and
   a pressure regulator, installed in the pressure supply flow path, which supplies the regulated gas pressure to the slit valve,
   wherein the pressure regulator is operative to supply gas pressure lower than the pressure required for the slit valve to open the slit aperture, when the first chamber is in a vacuum state and the second chamber is in an atmospheric pressure state.

2. The apparatus according to claim 1, wherein a pressure indicator is installed in the pressure regulator.

3. The apparatus according to claim 1, wherein the slit valve includes a valve plate, a piston rod operatively connected to the valve plate, and a pressure actuated cylinder operatively connected to the piston rod.

4. The apparatus according to claim 3, further comprising a bidirectional control valve installed between the pressure actuated cylinder and the air source, and wherein the directional control valve comprises a first direction flow path and a second direction flow path.

5. The apparatus according to claim 4, wherein a pressure indicator is disposed in the second direction flow path.

6. The apparatus according to claim 1, wherein the pressure regulator is an automatic operation type regulator or a manual operation type regulator.

7. The apparatus according to claim 1, further comprising a controller connected to the pressure regulator and configured to have a control mode in which the controller controls the pressure regulator to limit the gas pressure supplied to the slit valve to a gas pressure lower than the gas pressure required to open the slit aperture, whereby the slit aperture will not be inadvertently opened when the first chamber is in a vacuum state and the second chamber is in an atmospheric pressure state.

8. A semiconductor manufacturing apparatus having a slit valve control system, comprising:
   first and second chambers disposed adjacent to each other;
   a first pressure detecting sensor installed on the first chamber;
   a second pressure detecting sensor installed on the second chamber;
   a slit aperture disposed between the first and second chambers;
   a slit valve to open and close the slit aperture;
   an air source to operate the slit valve;
   a pressure supply flow path connecting the slit valve with the air source; and
   a pressure regulator installed in the pressure supply flow path to regulate pressure supplied from the air source; and
   wherein the pressure regulator is operative to supply gas pressure lower than the pressure required for the slit valve to open the slit aperture, when a pressure difference between the first and second chambers exists and the pressure difference is larger than a predetermined pressure difference.

9. The apparatus according to claim 8, wherein a pressure indicator is installed in the pressure regulator.

10. The apparatus according to claim 9, wherein the slit valve includes a valve plate to open and close the slit aperture, and a cylinder and a piston rod which move in accordance with the pressure supplied by the air source, and wherein the valve plate is attached to the piston rod.

11. The apparatus according to claim 10, further comprising a direction control valve installed between the slit valve and air source, and wherein the direction control valve comprises a first direction flow path and a second direction flow path.

12. The apparatus according to claim 11, wherein a pressure indicator is disposed in the second direction flow path.

13. The apparatus according to claim 8, wherein the pressure regulator is an automatic operation type regulator or a manual operation type regulator.

14. A method of controlling a pneumatically operated slit valve in a semiconductor manufacturing apparatus having a first process chamber, a second chamber, and a slit aperture via which interiors of the first and second process chambers are connected, and wherein the slit valve is movable between a closed position at which the slit valve blocks the slit aperture and an open position at which the slit aperture between the interiors of the first and second chambers is open, the method comprising:
   providing a fixed pressure value;
   determining the magnitude of a pressure difference between the first and second chambers;
   comparing the pressure difference with the fixed pressure value; and
   regulating pressure applied to the slit valve to open the slit aperture to a pressure based on the comparison of the calculated pressure difference with the fixed pressure value.

15. The method according to claim 14, wherein one of the first and second process chambers is under vacuum pressure and the other chamber is under atmospheric pressure.

16. The method according to claim 14, comprising supplying air to the slit valve under pressure from an air source.

17. The method according to claim 16, comprising supplying the air from the air source to the slit valve via an air supply flow line, and controlling the direction in which air flows from the air supply flow line to the slit valve, and wherein the regulating of the pressure comprises regulating the pressure of the air in the air supply flow line.

18. The method according to claim 17, comprising indicating the pressure in the air supply flow line.

19. The method according to claim 16, wherein the regulating of the pressure supplied to the slit valve comprises regulating the pressure of the air to a pressure less than a pressure required to operate the slit valve, when the calculated pressure difference is greater than the fixed pressure value while one of the first and second chambers is under vacuum pressure and the other chamber is under atmospheric pressure.

20. The method according to claim 14, wherein the providing of the fixed pressure value comprises inputting the value into a controller, and wherein the calculating of the pressure difference between the first and second chambers is accomplished by the controller.

21. The method according to claim 16, wherein the regulating of the pressure supplied to the slit valve comprises regulating the pressure of the air to a pressure less than a pressure required to move the slit valve to the open position thereof, when the calculated pressure difference is greater than the fixed pressure value and the slit valve is in the closed position thereof while one of the first and second chambers is under vacuum pressure and the other chamber is under atmospheric pressure.

22. The method according to claim 14, wherein the determining of the pressure difference comprises detecting the magnitude of the pressures in the first process chamber and the second chamber, respectively, and calculating the pressure difference between the first and second chambers based on the detected magnitudes of the pressures.

23. A semiconductor manufacturing apparatus having a slit valve control system, comprising:
   first and second chambers disposed adjacent to each other;
   a first pressure sensor connected to the first chamber and operative to sense the magnitude of the pressure in the first chamber and issue a signal representative of the magnitude of the sensed pressure in the first chamber;
   a second pressure sensor connected to the second chamber and operative to sense the magnitude of the pressure in the second chamber and issue a signal respectively representative of the magnitude of the sensed pressure in the second chamber;
   a slit aperture disposed between the first and second chambers;
   a pneumatically operated slit valve, the slit valve movable between an open position at which the slit aperture is open between the first and second chambers and a closed position at which the slit aperture is blocked by the slit valve;
   an air source to operate the slit valve;
   a pressure supply flow path connecting the slit valve with the air source;
   a pressure regulator installed in the pressure supply flow path to regulate the pressure of air supplied from the air source and flowing to the slit valve along the pressure supply path, the pressure regulator being adjustable such that the regulated pressure of the air can be changed; and
   a controller connected to the first and second pressure detecting sensors so as to receive the signals issued by the pressure sensors, connected to the pressure regulator such that the controller can adjust the regulator to set the pressure to which the air flowing along the supply path is regulated by the regulator, and configured to control the pressure regulator on the basis of the pressures in the first and second chambers as represented by the signals issued by the pressure sensors,
   wherein the pressure regulator is operative to supply a gas pressure which is lower than a pressure required for the slit valve to open the slit aperture, when the pressure difference between the first and second chambers exists and the pressure difference is larger than a predetermined pressure difference.

24. The apparatus according to claim 23, wherein the controller is configured to calculate the difference between values of the signals issued by the pressure-detecting sensors, and compare the difference with a fixed pressure value.

25. The apparatus according to claim 24, wherein the controller is configured to regulate the pressure of the air to a pressure less than a pressure required to move the slit valve to the open position thereof, when the calculated pressure difference is greater than the fixed pressure value while the slit valve is in the closed position thereof and one of the first and second chambers is under vacuum pressure and the other chamber is under atmospheric pressure.

* * * * *